(12) United States Patent
Shiobara

(10) Patent No.: US 8,883,405 B2
(45) Date of Patent: Nov. 11, 2014

(54) METHOD FOR FORMING PATTERN

(75) Inventor: Eishi Shiobara, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 138 days.

(21) Appl. No.: 13/595,244

(22) Filed: Aug. 27, 2012

(65) Prior Publication Data

US 2013/0164691 A1 Jun. 27, 2013

(30) Foreign Application Priority Data

Dec. 26, 2011 (JP) ................................. 2011-283993

(51) Int. Cl.
*G03F 7/20* (2006.01)
(52) U.S. Cl.
USPC ........................................................ 430/322
(58) Field of Classification Search
CPC ........................................................ G03F 7/20
USPC ........................................................ 430/322
See application file for complete search history.

(56) References Cited

U.S. PATENT DOCUMENTS

| 5,955,244 | A * | 9/1999 | Duval | ............................ 430/314 |
| 6,760,400 | B2 | 7/2004 | Watanabe et al. | |
| 7,217,492 | B2 | 5/2007 | Yoneda et al. | |
| 7,727,902 | B2 | 6/2010 | Takei et al. | |
| 2010/0028802 | A1 * | 2/2010 | Konno et al. | ............... 430/270.1 |
| 2010/0081081 | A1 | 4/2010 | Enomoto et al. | |
| 2011/0070404 | A1 * | 3/2011 | Naoi | .............................. 428/156 |
| 2011/0189617 | A1 | 8/2011 | Naka | |
| 2013/0026644 | A1 * | 1/2013 | Yu et al. | ......................... 257/774 |

OTHER PUBLICATIONS

Taiwanese Office Action issued May 19, 2014, in Taiwan Patent Application No. 101130308 (with English translation).

* cited by examiner

*Primary Examiner* — Kathleen Duda
(74) *Attorney, Agent, or Firm* — Oblon, Spivak, McClelland, Maier & Neustadt, L.L.P.

(57) ABSTRACT

According to one embodiment, a method is disclosed for forming a pattern. The method can include forming a resist film above a subject. The resist film includes a photosensitive material. The resist film has a concentration profile having a concentration of the photosensitive material being higher on a side of a bottom of the resist film than on a side of a surface of the resist film. A portion of the resist film has a maximum concentration of the photosensitive material existing closer to the side of the bottom than a center of the resist film in a thickness direction. The method can include irradiating the resist film with a light from the side of the surface. The method can include developing the resist film after the resist film being irradiated with the light.

14 Claims, 5 Drawing Sheets

METHOD FOR FORMING PATTERN

CROSS-REFERENCE TO RELATED APPLICATIONS

This application is based upon and claims the benefit of priority from Japanese Patent Application No. 2011-283993, filed on Dec. 26, 2011; the entire contents of which are incorporated herein by reference.

FIELD

Embodiments described herein relate generally to a method for forming a pattern.

BACKGROUND

In recent years, as semiconductor devices become finer, requirements for EUV lithography technology utilizing Extreme Ultra Violet (EUV) light having wavelength of 13.5 nm as exposure light increase. A resist material for the EUV lithography is required to have high sensitivity, reduced line width roughness (LWR), and high resolution.

DETAILED DESCRIPTION

Figure 1A:
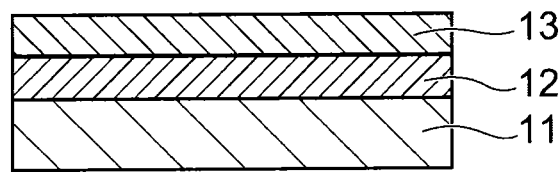
FIGS. 1A to 2C are schematic sectional views showing a method for forming a pattern of a first embodiment.

According to one embodiment, a method is disclosed for forming a pattern. The method can include forming a resist film above a subject. The resist film includes a photosensitive material. The resist film has a concentration profile having a concentration of the photosensitive material being higher on a side of a bottom of the resist film than on a side of a surface of the resist film. A portion of the resist film has a maximum concentration of the photosensitive material existing closer to the side of the bottom than a center of the resist film in a thickness direction. The method can include irradiating the resist film with a light from the side of the surface. The method can include developing the resist film after the resist film being irradiated with the light.

In KrF exposure and ArF exposure, a chemically amplified resist including a photosensitizing agent which is decomposed by absorbing exposure light to generate an acid is used. The photosensitizing agent is called a photo acid generator (PAG). The acid generated by the acid generator reacts with an insoluble protective group of a polymer in the resist, and varies solubility with respect to a developer of an exposed portion.

The chemically amplified resist can be used also in the EUV exposure. However, the EUV exposure has an acid generating mechanism which is different from mechanisms of the KrF exposure and the ArF exposure.

Energy of the KrF exposure is 5.0 eV, energy of the ArF exposure is 6.5 eV, and ionizing energy of each of carbon, oxygen and hydrogen which are main constituent elements of the resist is about 10 eV. In contrast to this, energy of the EUV exposure of a wavelength of 13.5 nm is 92 eV, and this is greater than ionizing energy of the main elements forming the resist.

Hence, in the KrF exposure and the ArF exposure, direct excitation of the acid generator is a main acid generating mechanism but in the EUV exposure, on the other hand, an acid generator is mainly decomposed by secondary electron energy generated by ionization of a resist material by EUV photon, and acid is generated.

Hence, in the EUV exposure, sensitivity of a resist does not depend on the acid generator but depends on an element which absorbs the EUV light and generates secondary electron.

Since a light source power of an EUV exposure device is not sufficient under the current circumstances, high sensitivity is required for the EUV resist as compared with the KrF resist and the ArF resist. In the EUV resist, however, there is a trade-off relation between sensitivity, resolution and line width roughness (LWR), and if the sensitivity is enhanced, for example, there is a tendency that the resolution is deteriorated or the roughness is increased.

Therefore, in the EUV lithography, it is required to enhance the sensitivity of a resist without deteriorating the resolution and the roughness.

Various embodiments will be described hereinafter with reference to accompanying drawings. In the drawings, the same elements are designated with the same symbols.

First Embodiment

FIGS. 1A to 2C are schematic sectional views showing a method for forming a pattern of a first embodiment.

The method for forming a pattern of the first embodiment has a process of irradiating a resist film with EUV light and then developing the resist film, and a process of subjecting a subject to be treated (subject, hereinafter) to treatment (such as etching and ion implantation) using the patterned resist film after development as a mask.

An example of the subject is a workpiece film 12 formed on a substrate 11 as shown in FIG. 1A. The substrate 11 is a support body of the subject, and, for example, a substrate on which a semiconductor device is formed, and a substrate of a photomask. Alternatively, the substrate 11 itself may be the subject. Examples of the workpiece film 12 are a semiconductor film, an insulating film and a conductive film which are etched using the resist film as a mask. The workpiece film 12 is not limited to a single layer, and may be a stacked body with a plurality of layers.

In the first embodiment, a lower layer film 13 is formed on the workpiece film 12 before the resist film is formed. The lower layer film 13 will be described in detail later.

Figure 1B:
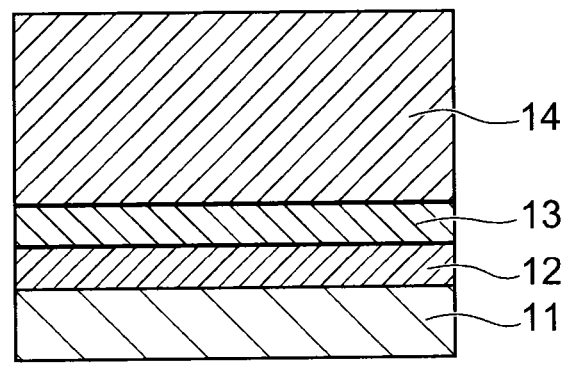
Figure 1C:
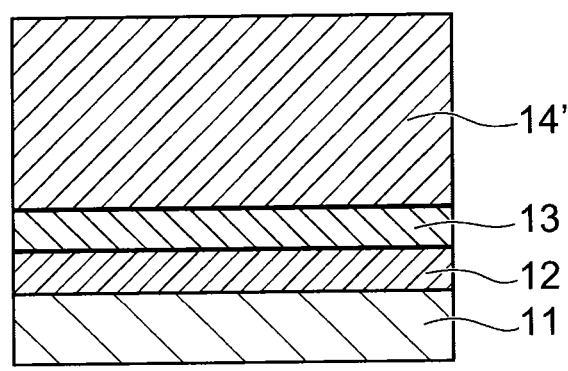

As shown in FIG. 1B, a resist film 14 is formed on the lower layer film 13. For example, the liquid resist film 14 is applied onto the lower layer film 13 by a spin coat method.

The resist film 14 includes a base resin and an acid generator. The base resin includes an organic compound such as a polymer or an oligomer having an insoluble protective group. In the specification, the acid generator and a later-described sensitizer are generically called a photosensitive material.

At the stage shown in FIG. 1B, at least the acid generator is included in the resist film 14 as the photosensitive material, and the sensitizer needs not to be included. The sensitizer includes an element which absorbs the EUV light and generates secondary electron.

Figure 5:
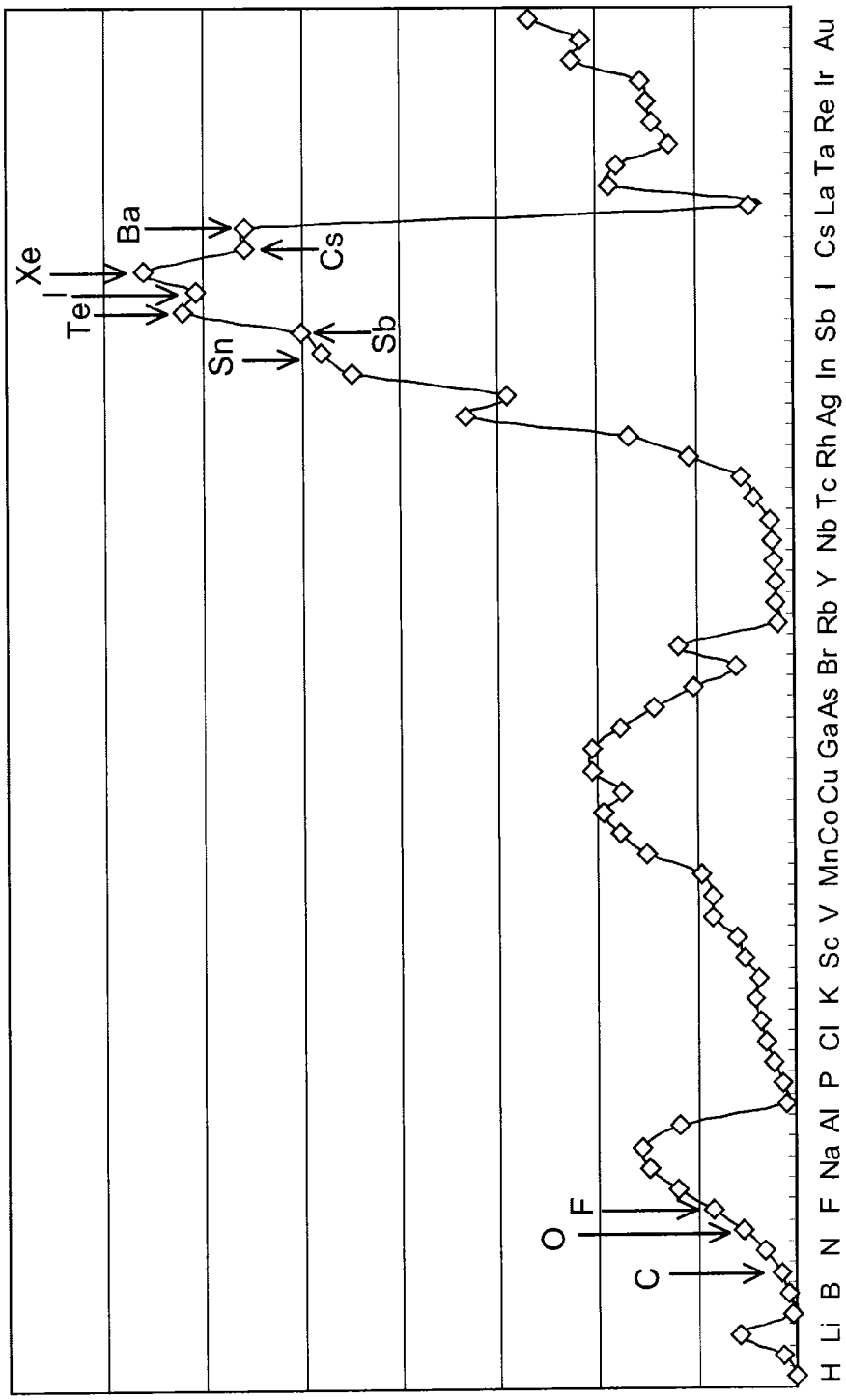
FIG. 5 shows a relative relation of a magnitude of the absorption coefficient of the EUV light for various elements.

FIG. 5 shows a relative relation of a magnitude of an absorption coefficient of the EUV light for various elements.

The sensitizer includes an element having an absorption coefficient of the EUV light greater than an absorption coefficient for carbon, oxygen and hydrogen which are main constituent elements of the base resin and the acid generator of the resist film 14. Among them, if an element (Sn, Sb, Te, I, Xe, Cs, Ba) of an atomic number in a range of 50 to 56 having a relatively great absorption coefficient is used for the sensitizer, the sensitivity with respect to the EUV light can be enhanced with a smaller amount of the element is used, and then the efficiency is excellent. In the embodiment, the example is described where among these elements of atomic numbers 50 to 56, iodine (I) having excellent affinity with respect to the base resin and the acid generator is used for the sensitizer.

The lower layer film 13 which is in contact with the resist film 14 under the resist film 14 includes the sensitizer. The sensitizer is included in the lower layer film 13 of the resin base as an iodine compound, for example. If a concentration of iodine in the lower layer film 13 is less than 1 atomic percent, a later-described sensitivity-enhancing effect of the resist film 14 which can be obtained by dispersion into the resist film 14 may be insufficient, and if the concentration of iodine in the lower layer film 13 exceeds 50 atomic percent, it becomes difficult to form the lower layer film 13. Therefore, the concentration of iodine in the lower layer film 13 is desirably in a range of 1 atomic percent or more and 50 atomic percent or less.

The lower layer film 13 is formed by the spin coat method, for example. Alternatively, the lower layer film 13 may be formed by chemical vapor deposition (CVD) or sputtering. For example, if the lower layer film 13 is applied in a liquid state onto the workpiece film 12 by the spin coat method, when heated by a hot plate, cross-link proceeds and the lower layer film 13 is insolubilized with respect to an organic solvent of the resist film 14. The heating treatment is performed for approximately 30 seconds to 120 seconds at the temperature of 150° C. to 250° C. for example.

The resist film 14 is formed on the lower layer film 13. After the resist film 14 is formed, a wafer including the substrate 11, the workpiece film 12, the lower layer film 13 and the resist film 14 is heated by the hot plate.

By the heating treatment, the sensitizer (iodine compound) in the lower layer film 13 is dispersed into the resist film 14. The sensitizer is dispersed from the lower layer film 13 into the resist film 14 through an interface between the lower layer film 13 and the resist film 14. By adjusting the heating temperature and the heating time at this time, a resist film 14' (shown in FIG. 1C) having a desired sensitizer concentration profile in a thickness direction can be obtained.

That is, a sensitizer concentration of the resist film 14' on a bottom side after the heating treatment becomes higher than that on a surface side. There is a possibility that the sensitizer concentration of the surface of the resist film 14' is zero. The sensitizer concentration in the thickness direction of the resist film 14' is varied continuously in some cases or varied in a stepwise in some cases. In any case, a portion of the resist film 14' having the maximum sensitizer concentration is located closer to the bottom side than a center in the thickness direction of the resist film 14'.

Here, the sensitizer concentration represents atomic percent and the number of atoms per unit volume of the element (e.g., iodine) having the absorption coefficient of the EUV light which is greater than the absorption coefficient for carbon, oxygen and hydrogen.

Since the sensitizer concentration of the resist film 14' on the bottom side is higher than the surface side and a portion of the resist film 14' having the maximum sensitizer concentration exists closer to the bottom side than the center in the thickness direction, an absorbing profile in which the absorption coefficient of the EUV light is continuously increased from the surface toward the bottom of the resist film 14' is obtained.

Figure 4A:
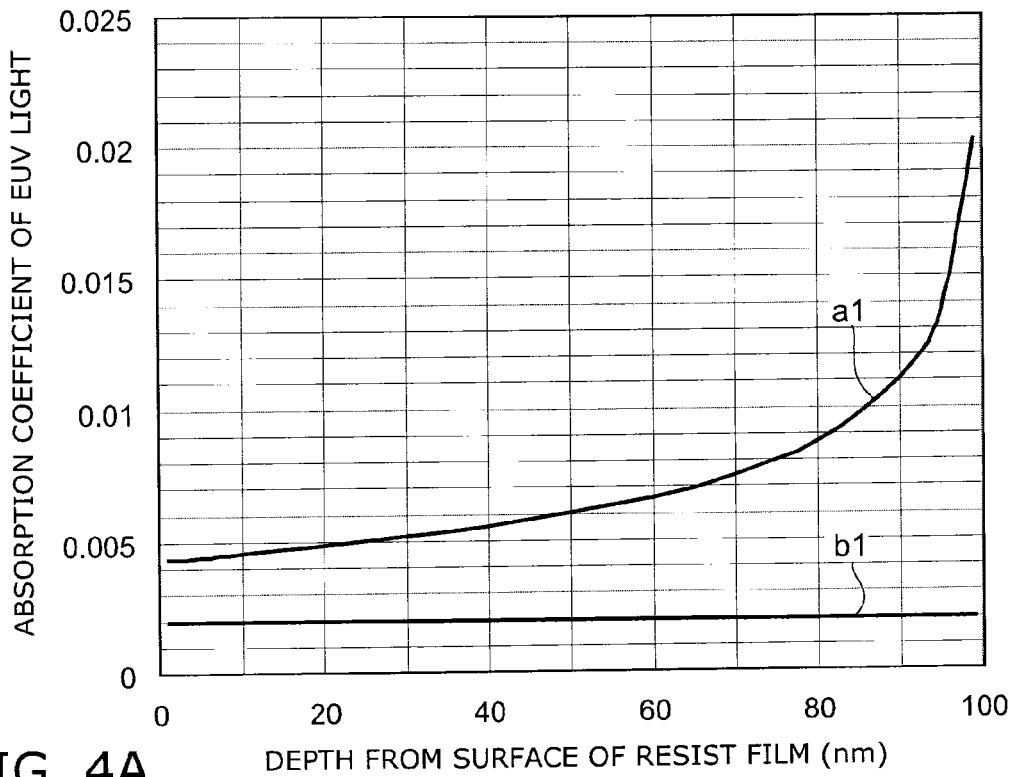
FIG. 4A is a view showing the relationship between a depth from a surface of a resist film and an absorption coefficient of an EUV light.

FIG. 4A shows one example of an absorbing profile a1. A horizontal axis represents a depth (nm) from the surface of the resist film 14', as a depth of the surface being 0. A vertical axis represents the absorption coefficient of the EUV light k of the resist film 14', which can be expressed by the following formula 1, for example.

$$k=1000\times(lnTr-ln(Tr-x))/x \qquad \text{formula 1,}$$

where Tr represents a film thickness of the resist film 14', and x represents a depth from the surface of the resist film 14'.

In the resist film 14' having the absorbing profile a1 shown in FIG. 4A, an increasing rate of the absorption coefficient k is increased from the surface toward the bottom. A transmission profile a2 shown in FIG. 4B is obtained from the absorbing profile a1.

Figure 4B:
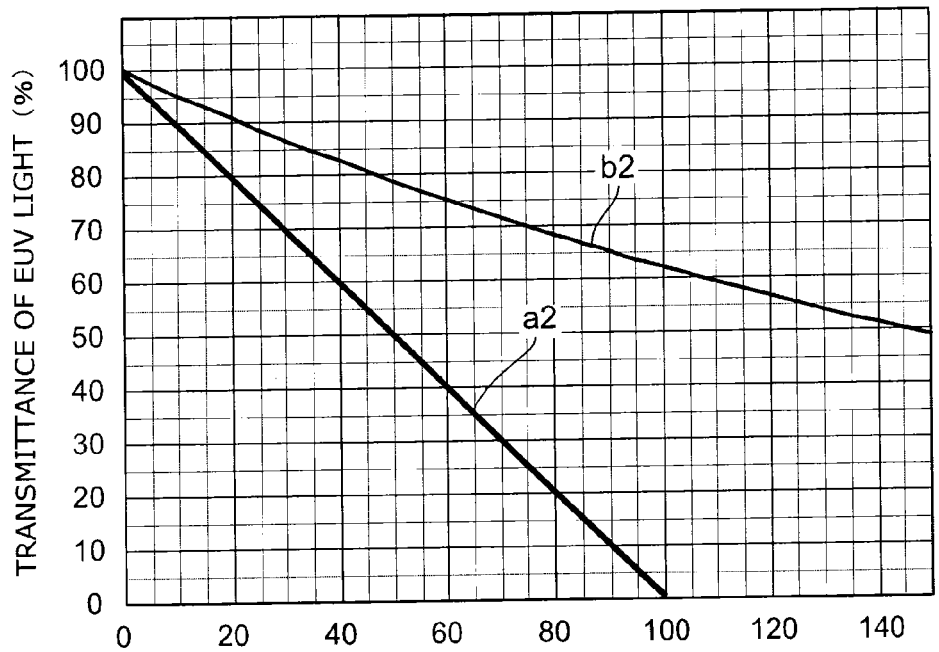
FIG. 4B is a view showing the relationship between the depth from the surface of the resist film and a transmittance of the EUV light.

A horizontal axis in FIG. 4B represents a depth (nm) from the surface of the resist film 14', as a depth of the surface being 0. A vertical axis represents a transmittance (percent) of the EUV light.

In the resist film 14' having the transmission profile a2 shown in FIG. 4B, the transmittance is decreased linearly with a substantially constant gradient from the surface toward the bottom. Therefore, in the resist film 14' of the embodiment, an absorbing mount of the EUV light per unit film thickness is substantially constant in the thickness direction. Hence, it is possible to reduce variation in an acid generation amount in the thickness direction of the resist film 14'.

Here, if the sensitizer concentration is made constant in the thickness direction of the resist film in a comparative example, the absorption coefficient becomes constant in the thickness direction of the resist film like an absorbing profile b1 shown in FIG. 4A, and a transmission profile b2 shown in FIG. 4B is obtained. In the comparative example, the EUV light-absorbing amount per unit film thickness of the resist film is decreased toward the bottom in terms of exponential function.

For example, when a thickness of the resist film is set to about 100 nm, in the comparative example, 60 to 70 percent of the EUV light which enters the surface of the resist film is not absorbed in the film and reaches the bottom of the resist film. That is, 30 to 40 percent of the incident EUV light is absorbed by the resist film, and the utilizing efficiency of the EUV light is poor.

In contrast to this, according to the embodiment, it is possible to give the transmission profile a2 shown in FIG. 4B to the resist film 14' by providing the resist film 14' with the above-described sensitizer concentration profile. If a resist film 14' having the transmission profile a2 and a thickness of, for example, 100 nm is formed, most of the EUV light which enters the surface is absorbed by the resist film 14' before the EUV light reaches the bottom, the utilizing efficiency of the EUV light is extremely excellent and sensitivity is high.

If the sensitizer is added, the sensitivity of the resist film 14' is enhanced, but if the sensitizer is excessively added, the transmittance is lowered, and this may cause deterioration in a resist shape after development. Hence, there is an upper limit of an additive amount of the sensitizer, and there is a limit to enhance the sensitivity by increasing the additive amount of the sensitizer.

In contrast, as for the embodiment, the light absorbing efficiency in the resist film 14' is enhanced and the sensitivity is enhanced by varying the concentration of the sensitizer in the thickness direction of the resist film 14' instead of increasing the amount of the sensitizer. Therefore, according to the embodiment, it is possible to suppress the deterioration in the resist shape after the development and to form a precise pattern, while improving the throughput by enhancing the sensitivity of the resist film 14'.

The absorbing profile a1 in FIG. 4A and the transmission profile a2 in FIG. 4B are one of the examples, and profiles given to the resist film 14 are not limited thereto. It is only necessary that the EUV light in the resist film 14' can be efficiently absorbed, and even if a profile which is closer to or similar to the profile a1 or a2 is given to the resist film 14, the same or similar effect can be obtained. The absorption coefficient k is not limited to the value defined in the formula 1.

The transmission profile a2 in FIG. 4B indicates that all of the EUV light which enters the resist film 14' having the film thickness of 100 nm is absorbed in the resist film 14'. The absorbing profile a1 in FIG. 4A is obtained by calculation to realize the transmission profile a2. If the iodine concentration at the bottom of the resist film 14' is adjusted in a range of 5 atomic percent or more and 10 atomic percent or less, for example, it is possible to realize the absorbing profile a1.

Also in the case where any of the elements of the atomic numbers 50 to 56 other than iodine is used as the sensitizer, the absorption coefficients of the EUV light of the elements of the atomic numbers 50 to 56 are relatively close to one another, therefore, if the concentration of the element at the bottom of the resist film 14' is adjusted in the range of 5 atomic percent or more and 10 atomic percent or less, it is possible to realize the absorbing profile a1.

The sensitizer is not limited to the element of the atomic number in the range of 50 to 56. If an element having the absorption coefficient of the EUV light greater than the absorption coefficient for carbon, oxygen and hydrogen which are main constituent elements of the resist film 14' is used, the sensitivity-enhancing effect can be obtained. For example, fluorine can be used for the sensitizer as well. An absorption coefficient of fluorine is about ⅕ of the absorption coefficient of iodine. Therefore, in order to realize the absorbing profile a1, the fluorine concentration at the bottom of the resist film 14' will be higher than 10 atomic percent.

Alternatively, when a transmission profile having a gradient smaller than the gradient of the transmission profile a2 is given to the resist film 14', the fluorine concentration at the bottom of the resist film 14' can be lower as compared with a case where the transmission profile is adjusted to the transmission profile a2.

Figure 2A:
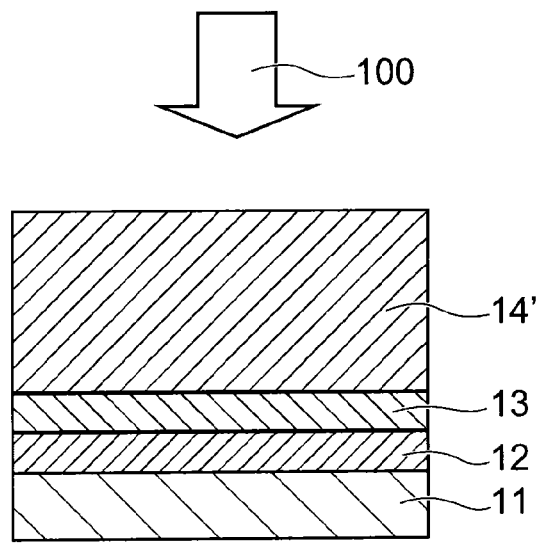

A resist film 14' having a concentration profile of the sensitizer in the thickness direction given by the above heating treatment is irradiated with EUV light 100 from the surface side as shown in FIG. 2A. A reflective or transmissive mask (not shown) is used for the exposure. Since the wavelength of the EUV light is 13.5 nm, the resist film 14' is irradiated with the EUV light 100 in a vacuum atmosphere.

Figure 2B:
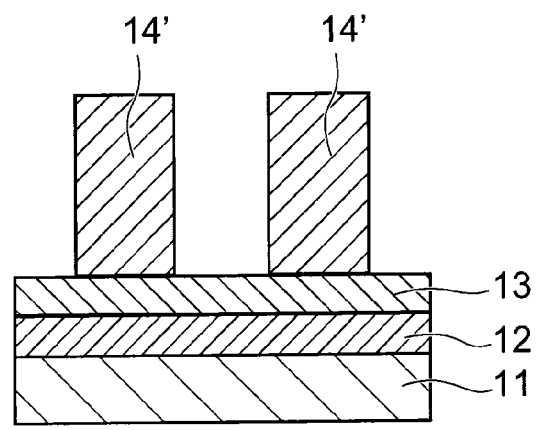

The resist film 14' irradiated with the EUV light 100 is subjected to post exposure bake (PEB) if necessary. Thereafter, development is performed using developer. Thereby, an exposed portion or a non-exposed portion of the resist film 14' is dissolved by the developer, and the resist film 14' is patterned as shown in FIG. 2B.

When the base resin of the resist film 14' is a polyhydroxystyrene (PHS)-based resin, a poly (meth) acrylate-based resin or a novolac-based resin, for example, it is possible to use a tetramethyl ammonium hydroxide (TMAH) developer using an alkali developer, more specifically, organic alkali. In this case, a positive resist pattern in which the exposed portion is dissolved by the developer is formed.

That is, a sensitizer existing on the exposed portion absorbs the EUV light to generate secondary electron, and an acid generator is decomposed by energy of the secondary electron to generate acid. The acid reacts with an insoluble protective group of an organic compound in the resist film 14', and the acid changes a group of the exposed portion to a soluble group with respect to the alkali developer.

Alternatively, if an organic solvent is used as the developer, it is possible to form a negative resist pattern in which an exposed portion is insoluble with respect to the organic solvent and a non-exposed portion is solved with respect to the developer.

Figure 2C:
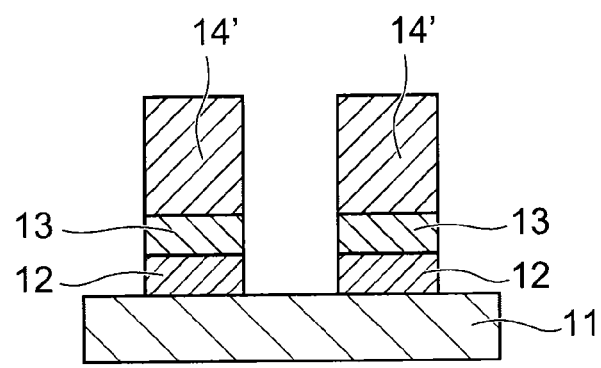

After the resist film 14' is developed, the resist film 14' is subjected to a rinse treatment, and if necessary, post bake. Then, the lower layer film 13 under the resist film 14', and the workpiece film 12 under the lower layer film 13 are etched as shown in FIG. 2C using the patterned resist film 14' as a mask. Thereby, the workpiece film 12 is patterned.

Second Embodiment

Figure 3A:
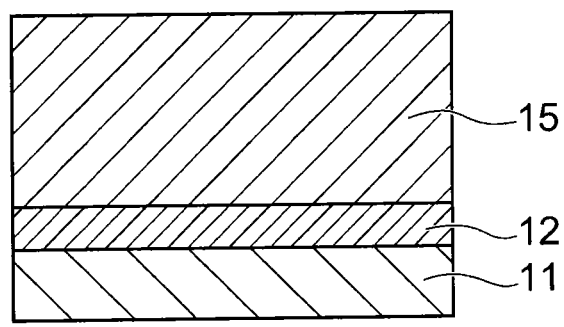
FIGS. 3A and 3B are schematic sectional views showing a method for forming a pattern according to a second embodiment.
Figure 3B:
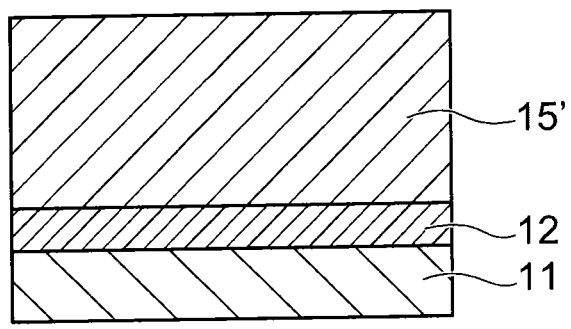

FIGS. 3A and 3B are schematic sectional views showing a method for forming a pattern according to a second embodiment.

In the second embodiment, the lower layer film 13 is not formed, and a resist film 15 is formed on the workpiece film 12 as shown in FIG. 3A. For example, the liquid resist film 15 is applied onto the workpiece film 12 by a spin coat method.

The resist film 15 includes a base resin and an acid generator. The base resin includes an organic compound such as a polymer having an insoluble protective group or an oligomer having an insoluble protective group. In the second embodiment, a sensitizer is previously included in the resist film 15.

The sensitizer includes an element of an atomic number in a range of 50 to 56 having an absorption coefficient of the EUV light greater than the absorption coefficient for carbon, oxygen and hydrogen which are main constituent elements of the base resin and the acid generator. Also in the second embodiment, the example is described where among these elements of atomic numbers 50 to 56, iodine having excellent affinity with respect to the base resin and the acid generator is used for the sensitizer.

After the resist film 15 is formed, a surface of the resist film 15 is washed before baking, and the sensitizer on the side of the surface of the resist film 15 is washed away.

As washing liquid at this time, washing liquid which does not solve an organic material forming the base resin and the acid generator of the resist film 15 is used. As such washing liquid, it is possible to use pure water, lower alcohol and 4-methyl-2 pentanol which is a solvent of an immersion protection film.

By the washing treatment, the sensitizer (iodine compound) on the surface side of the resist film 15 is removed, and a resist film 15' shown in FIG. 3B is obtained. That is, in the resist film 15' after the washing treatment, the sensitizer concentration on the surface side of the resist film 15' becomes lower than the sensitizer concentration on the bottom side of the resist film 15', and a portion of the resist film 15' having the maximum sensitizer concentration is closer to the bottom than the center of the resist film 15' in the thickness direction.

Also in the second embodiment, by giving the above sensitizer concentration profile to the resist film 15', it is possible to obtain an absorbing profile in which an absorption coefficient of the EUV light is continuously increased from the surface toward the bottom of the resist film 15', and a transmission profile in which a transmittance of the EUV light is linearly decreased with a substantially constant gradient from the surface toward the bottom of the resist film 15' similar to the first embodiment.

That is, also in the second embodiment, the light absorbing efficiency in the resist film 15' is enhanced and the sensitivity is enhanced by varying the concentration of the sensitizer in the thickness direction of the resist film 15' instead of increasing the amount of the sensitizer. Therefore, it is possible to to suppress the deterioration in the resist shape after the development and to form a precise pattern, while improving the throughput by enhancing the sensitivity of the resist film 15.

The resist film 15' having the sensitizer concentration profile in the film thickness direction given by the above washing treatment is exposed to the EUV light and developed similar to the first embodiment, and the resist film 15' is patterned. Furthermore, the workpiece film 12 is etched using the patterned resist film 15' as a mask, and the workpiece film 12 is patterned.

Although the EUV exposure is described in the above-described embodiments, the invention can also be applied to the KrF exposure and the ArF exposure. In the KrF exposure and the ArF exposure, the acid generator mainly generates acid by direct excitation by exposure light. Therefore, the sensitivity of the resist film depends on the acid generator.

Therefore, in the KrF exposure and the ArF exposure, a concentration profile in which a concentration of the acid generator as a photosensitive material is higher on the bottom side than a concentration on the surface side and a portion of the resist film having the maximum acid generator concentration is closer to the bottom than the center in the thickness direction is given to the resist film. Thereby, it is possible to realize a absorbing profile which is continuously increased from the surface toward the bottom, and a transmission profile in which a transmittance is linearly decreased from the surface toward the bottom.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for forming a pattern comprising:
    forming a lower layer film above a subject, the lower layer film including a photosensitive material;
    forming a resist film, on the lower layer film;
    dispersing the photosensitive material into the resist film from the lower layer film, and providing a concentration profile to the resist film, the concentration profile having a concentration of the photosensitive material being higher on a side of a bottom of the resist film than on a side of a surface of the resist film, a portion of the resist film having a maximum concentration of the photosensitive material existing closer to the side of the bottom than a center between the bottom and the surface of the resist film;
    irradiating the resist film having the concentration profile of the photosensitive material with a light from the side of the surface; and
    developing the resist film after the resist film being irradiated with the light.

2. The method according to claim 1, wherein the photosensitive material includes a sensitizer and an acid generator, the sensitizer absorbing an EUV (Extreme Ultra Violet) light used as the light and generating a secondary electron, the acid generator generating an acid by energy of the secondary electron, and
    a concentration of the sensitizer on the side of the bottom is higher than a concentration of the sensitizer on the side of the surface, and a portion of the resist film having a maximum concentration of the sensitizer exists closer to the side of the bottom than the center in the thickness direction.

3. The method according to claim 2, wherein the resist film mainly includes carbon, oxygen and hydrogen, and
    the sensitizer includes an element having an absorption coefficient of the EUV light greater than an absorption coefficient of the EUV light for the carbon, the oxygen and the hydrogen.

4. The method according to claim 3, wherein the sensitizer includes an element of an atomic number in a range of 50 to 56.

5. The method according to claim 4, wherein the sensitizer includes iodine.

6. The method according to claim 5, wherein a concentration of the iodine at the bottom of the resist film is 5 atomic percent or more and 10 atomic percent or less.

7. The method according to claim 3, wherein the sensitizer includes fluorine.

8. The method according to claim 2, further comprising:
    forming a lower layer film above the subject before the forming the resist film, the lower layer film including the sensitizer,
    after disposing on the lower layer film a resist film before being provided with the concentration profile, the sensitizer being dispersed into the resist film from the lower layer film, and the concentration profile being given to the resist film.

9. The method according to claim 2, wherein the sensitizer is dispersed into the resist film by a heating treatment.

10. The method according to claim 2, wherein the sensitizer is iodine, and
    a concentration of the iodine in the lower layer film before the iodine being dispersed into the resist film is in a range of 1 atomic percent or more and 50 atomic percent or less.

11. The method according to claim 2, wherein the resist film includes such an absorbing profile that an absorption coefficient with respect to the EUV light is continuously increased from the surface toward the bottom.

12. The method according to claim 11, wherein an increasing rate of the absorption coefficient is increased from the surface toward the bottom of the resist film.

13. The method according to claim 1, wherein the photosensitive material is dispersed into the resist film by a heating treatment.

14. The method according to claim 1, wherein the lower layer film is heated after being formed above the subject, and the lower layer film is insolubilized with respect to the resist film.

* * * * *